(12) United States Patent
Hu et al.

(10) Patent No.: US 9,158,142 B2
(45) Date of Patent: Oct. 13, 2015

(54) DISPLAY UNIT, ELECTRONIC DEVICE AND ASSEMBLING METHOD FOR ELECTRONIC DEVICE

(75) Inventors: Chih-Kai Hu, Taoyuan County (TW); Hsien-Wei Juan, Taoyuan County (TW); I-Cheng Chuang, Taoyuan County (TW); Yi-Ting Liu, Taoyuan County (TW); Shih-Po Chien, Taoyuan County (TW); Yin-Chou Chen, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 57 days.

(21) Appl. No.: 13/447,312

(22) Filed: Apr. 16, 2012

(65) Prior Publication Data
US 2013/0271896 A1 Oct. 17, 2013

(51) Int. Cl.
*H05K 5/00* (2006.01)
*H05K 7/00* (2006.01)
(Continued)

(52) U.S. Cl.
CPC *G02F 1/133308* (2013.01); *G02F 2001/13332* (2013.01); *G02F 2001/133311* (2013.01); *G02F 2001/133331* (2013.01); *G02F 2202/28* (2013.01)

(58) Field of Classification Search
CPC .................. H05K 5/0026; H05K 2201/10159
USPC ............ 361/679.01–679.09, 679.26–679.29, 361/679.3, 679.55–679.59, 679.1–679.19, 361/679.21–679.29, 679.31–679.45, 361/679.55–679.6, 724–747; 248/917–924, 248/80–88, 155.1–155.5, 166–173, 248/180.1–186.2, 229.1–231.51, 271.4, 248/292.14, 316.1–316.8; 348/14.07, 348/51–52, 177, 333.01–333.13, 739; 345/156, 157, 168–184; 292/1–62, 292/113, 169.11–169.23, 341.11–341.19; 369/75.1, 75.2, 75.11, 75.21, 76, 369/77.11, 77.21, 78, 79, 80, 81, 82
See application file for complete search history.

(56) References Cited

U.S. PATENT DOCUMENTS 7,031,148 B1 * 4/2006 Lin .......................... 361/679.08
7,800,730 B2 9/2010 Kang et al.
(Continued)

FOREIGN PATENT DOCUMENTS

CN 101493587 7/2009
CN 101598860 12/2009
(Continued)

OTHER PUBLICATIONS

"Office Action of Taiwan Counterpart Application", issued on Jul. 22, 2014, p. 1-p. 8.
(Continued)

*Primary Examiner* — Jerry Wu
(74) *Attorney, Agent, or Firm* — Jianq Chyun IP Office

(57) ABSTRACT

A display unit and an electronic device and an assembling method are provided, wherein the electronic device includes a case and a display unit. The case includes a holding compartment. The display unit is accommodated in the holding compartment, and includes a display module, a transparent cover layer and a transparent adhesive tape. The transparent adhesive tape is configured between the display module and the transparent adhesive tape, and the transparent adhesive tape is adhered to the transparent cover layer. The transparent adhesive tape includes a flange portion extending beyond the display module, and the flange portion can be bent to secure the display unit to the case.

6 Claims, 7 Drawing Sheets

(51) Int. Cl.
  *G09G 5/00* (2006.01)
  *G06F 3/033* (2013.01)
  *G06F 3/045* (2006.01)
  *G02F 1/1333* (2006.01)

(56) References Cited

U.S. PATENT DOCUMENTS

2004/0041796 A1    3/2004   Lee
2010/0315575 A1*  12/2010   Chang et al. .................... 349/62
2011/0032178 A1    2/2011   Lee
2012/0127639 A1*   5/2012   Lai .......................... 361/679.01

FOREIGN PATENT DOCUMENTS

| | | |
|---|---|---|
| CN | 104199206 | 12/2014 |
| TW | 201022393 | 6/2010 |
| TW | 201028596 | 8/2010 |
| TW | 201100908 | 1/2011 |
| TW | 201106052 | 2/2011 |
| WO | 2011102311 | 8/2011 |

OTHER PUBLICATIONS

"Office Action of China Counterpart Application", issued on May 6, 2015, p. 1-p. 7.

* cited by examiner

DISPLAY UNIT, ELECTRONIC DEVICE AND ASSEMBLING METHOD FOR ELECTRONIC DEVICE

TECHNICAL FIELD OF INVENTION

The disclosure relates to a display unit, more particularly to an electronic device assembled with the display unit and an assembling method for the electronic device.

PRIOR ART

Along with the rapid development of portable electronic devices, the various types of thin display technology are applied to the display module of the portable electronic devices, for example, the liquid crystal display (LCD) module, the organic light emitting diode (OLED) module.

FIG. 1 is a partial, schematic view diagram of a conventional LCD module assembled in an electronic device. A liquid crystal module 130 is covered with a layer of cover glass 110 and a glue is used to bond the surfaces of the two components together. An external casing further covers the periphery of the cover glass 110, and the case, the cover glass 110 and the liquid crystal display module 130 are secured by the glue 120 at the rim.

As the screen dimensions of portable electronic devices become bigger to conform with the demands of users for larger display screens, the rim of a screen surface gradually reduces. If the external casing is bonded to the top surface of the cover glass, a substantial portion of the rim for the rim to bond with the external casing is still required to achieve a sufficient adhesion strength. This type of assembling structure may limit the size of the display screen and increases the dimension of the overall device.

The invention provides a display unit to enhance the structural strength of the electronic device.

The invention provides an electronic device in which the viewable area of the screen is increased.

The invention provides an assembling method of an electronic device for securing a display module on an electronic device.

The invention provides a display unit. The display unit includes a display module, a transparent cover layer and a transparent adhesive tape. The display module includes corresponding first and second surfaces, wherein an image is displayed on the first surface. The transparent adhesive tape is disposed between the first surface of the display module and the transparent cover layer, and the transparent adhesive tape is adhered to the transparent cover layer. The transparent adhesive tape includes a flange portion, extending beyond the first surface. Further, the flange portion can be bent to secure the display module.

The invention provides an assembling method of an electronic device including the following steps. A display unit is placed in a holding compartment of a case of an electronic device. The display unit includes at least a display module, a transparent cover layer and a transparent adhesive tape. The transparent adhesive tape is disposed between the display module and the transparent cover layer, and the transparent adhesive layer includes a flange portion extending beyond the display module. Then, the flange portion is bent for adhering the display unit to the inside of the holding compartment.

According to an exemplary embodiment of the invention, the above-mentioned flange portion of the unit can be bent to the second surface and the portion that is in contact with the second surface has an adhesive and is adhered to the display module.

According to an exemplary embodiment of the invention, the second surface of the above-mentioned display unit is leaned against a back plate. The flange portion of the above-mentioned display unit is bent to the second surface and both sides of the flange portion that reach the second surface have an adhesive, wherein one side is adhered to the second surface of the display module, while another side is adhered to the back plate.

In an exemplary embodiment of the invention, the second surface of the display unit is leaned against a back plate. The back plate of the display unit includes at least a hole. The flange portion passes through the hole and is bent to attach to the surface of the back plate that is farther away from the display module.

In an exemplary embodiment of the invention, the flange portion of the transparent adhesive tape of the display unit is not transparent.

In an exemplary embodiment of the invention, the transparent adhesive tape of the display unit includes an anti-flash film and an adhesive material.

In an exemplary embodiment of the invention, the transparent adhesive tape of the display unit includes polyethylene terephthalate flexible substrate and an optical clear adhesive.

In an exemplary embodiment of the invention, the transparent adhesive tape of the display unit includes a touch panel and an adhesive material.

In an exemplary embodiment of the invention, the flange portion of the display unit includes perforated line for bending.

In an exemplary embodiment of the invention, the transparent adhesive tape covers the entire first surface. Based on the above disclosure, in the display unit, and the electronic device and the assembling method thereof of the invention, the adhesive tape includes a flange portion extending beyond the display module, and the flange portion can be bent to allow the display unit to adhere to the inside of the holding compartment of the electronic device. Hence, the viewable range of the screen can be greatly enlarged.

The disclosure and certain merits provided by the application can be better understood by way of the following exemplary embodiments and the accompanying drawings, which are not to be construed as limiting the scope of the disclosure.

DISCLOSED EMBODIMENTS

Figure 1:
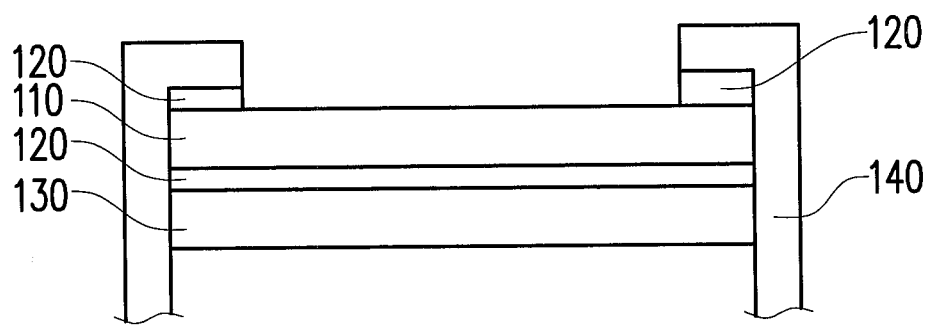
FIG. 1 is a partial, schematic view diagram of a conventional LCD module assembled in an electronic device.
Figure 2:
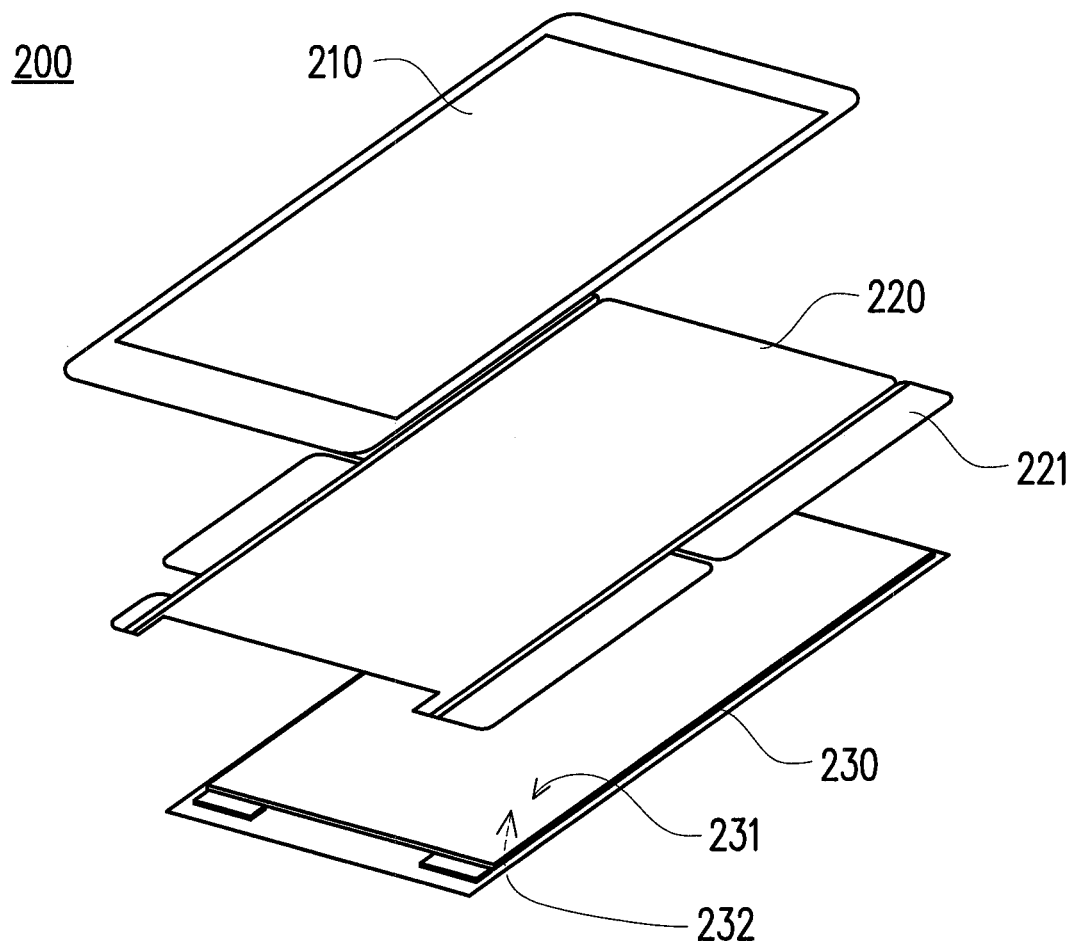
FIG. 2 is an exploded perspective view of a display unit according to an exemplary embodiment of the invention.

FIG. 2 is an exploded perspective view of a display unit according to an exemplary embodiment of the invention. Referring to FIG. 2, in this exemplary embodiment, the display unit 200 includes a transparent cover layer 210, a transparent adhesive tape 220, a display module 230. The display module 230 includes a first surface 231 and a corresponding second surface 232. The transparent adhesive tape 220 is disposed between the transparent cover layer 210 and the display module 230. The above transparent adhesive tape 220 includes a flange portion 221, extending beyond the first surface 231. Alternatively speaking, when the transparent adhesive tape 220 is disposed on the display module 230, the flange portion 221 of the transparent adhesive tape 220 extends beyond the first surface 231. The profile of the transparent adhesive tape 220 does not exactly correspond to the profile of the display module 230, and the flange portion 221 that extends beyond the first surface 231 may be not transparent.

More specifically, the transparent adhesive tape 220 may be composed with a transparent substrate and an adhesive material (not shown), wherein the transparent flexible substrate may be a polyethylene terephthalate (PET) flexible substrate or an anti splash film. The adhesive material, which is adhered to the transparent cover 210 or the first surface 231 of the display module 230, needs to be a transparent adhesive material, for example, an optical clear adhesive. Moreover, since the adhesive material configured at the flange portion 221 does not affect the viewable range of the display module 230, the adhesive material configured at the flange portion 221 can be opaque.

The transparent adhesive tape 220 of this exemplary embodiment may be a touch panel. Since the substrate of a majority of the touch panels is a flexible substrate constituted with a PET material, the flange portion 221 of the transparent adhesive tape 220 can be formed by extending the flexible substrate of the touch panel. Further combining the extending portion of the flexible substrate of the touch panel with an adhesive material, the function of the transparent adhesive tape 220 is achieved. The formation of the flange portion may be achieved by extending a single layer of the PET substrate or the entire touch panel. If the flange portion is formed by extending a single layer of a PET substrate, a greater bending angle is achieved. It is to be understood that the above embodiments are presented by way of example and not by way of limitation, and many modifications and variations shall be apparent to practitioners skilled in this art.

Figure 3:
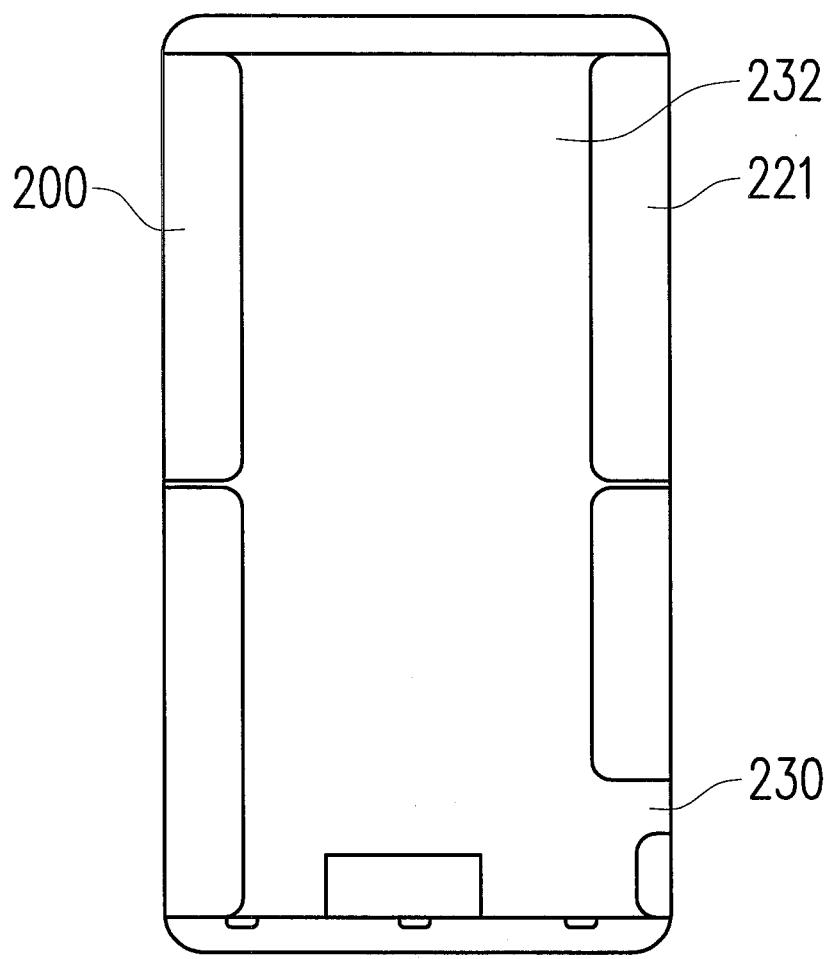
FIG. 3 is a bottom view of the display unit in FIG. 2.

FIG. 3 is a bottom view of the display unit in FIG. 2. Referring to FIG. 3, the flange portion 221 is bent to the second surface 232 of the display module 230 and is secured to the display module 230 with the adhesive material. Moreover, if the transparent adhesive tape 220 is a touch panel, the periphery of the touch panel is normally configured with metal lines for lowering the loss of the signal strength. The region distributed with metal lines is known as an opaque conductive line region R10. In this exemplary embodiment, the opaque conductive line region R10 is disposed at the flange portion 221; hence, the opaque conductive line region at the periphery of the touch panel, which is bendable, can be narrowed.

Figure 4:
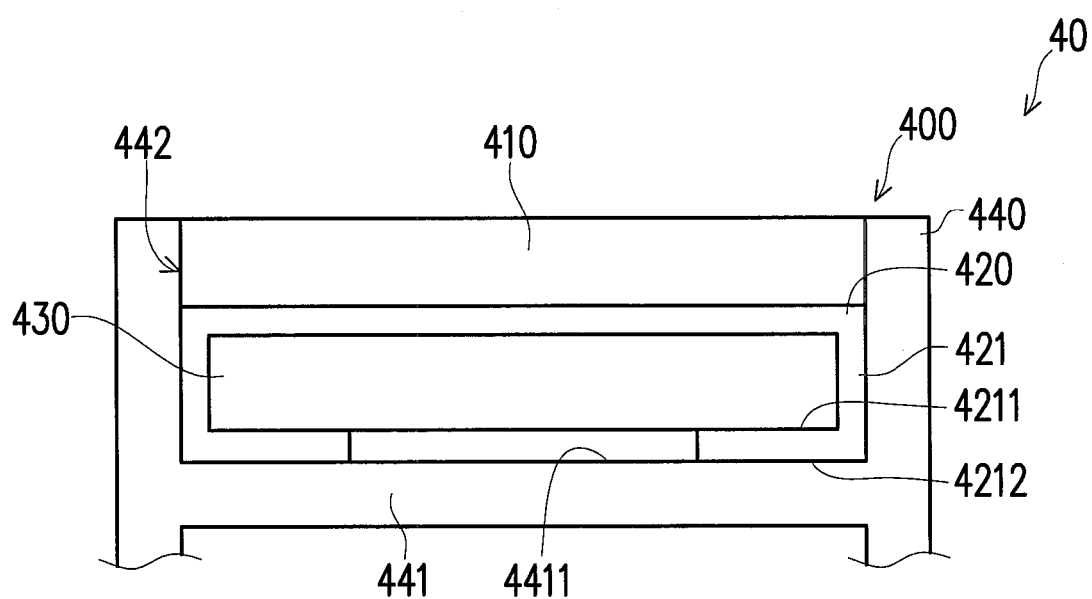
FIG. 4 is a partial cross-sectional view diagram of an electron device 40 according to an exemplary embodiment of the invention.

FIG. 4 is a partial cross-sectional view diagram of an electron device 40 according to an exemplary embodiment of the invention. Referring to FIG. 4, in this exemplary embodiment, the assembled structure of a display unit 400 and a case 440 is further provided. The display unit 400 includes a display module 430, a transparent cover layer 410 and a transparent adhesive tape 420. The transparent adhesive tape 420 is disposed between the display module 430 and the transparent cover layer 410. The transparent adhesive tape 420 also includes a flange portion extending beyond the display module 430. The case 440 includes a back plate 441, and the display unit 400 is disposed in a holding compartment 442 of the display module 430. The display unit 400 is bonded to the top surface 4411 of the back plate 441 at the bottom of the holding compartment 442 through the flange portion 421, wherein the first flange surface 4211 of the flange portion 421 is bonded to the display module 430, and the second flange surface 4212 is bonded to the top surface 4411 of the back plate 441 to secure the display unit 10 on the back plate 441. More specifically, according to the exemplary embodiment of the invention, the method of anchoring the display unit 400 on the electronic device 40 is via bonding and does not require the covering of the display module 430 with the case 440 to secure the display module. The entire display module 430 is completely exposed to increase the viewable range of the electronic device 40.

Figure 5:
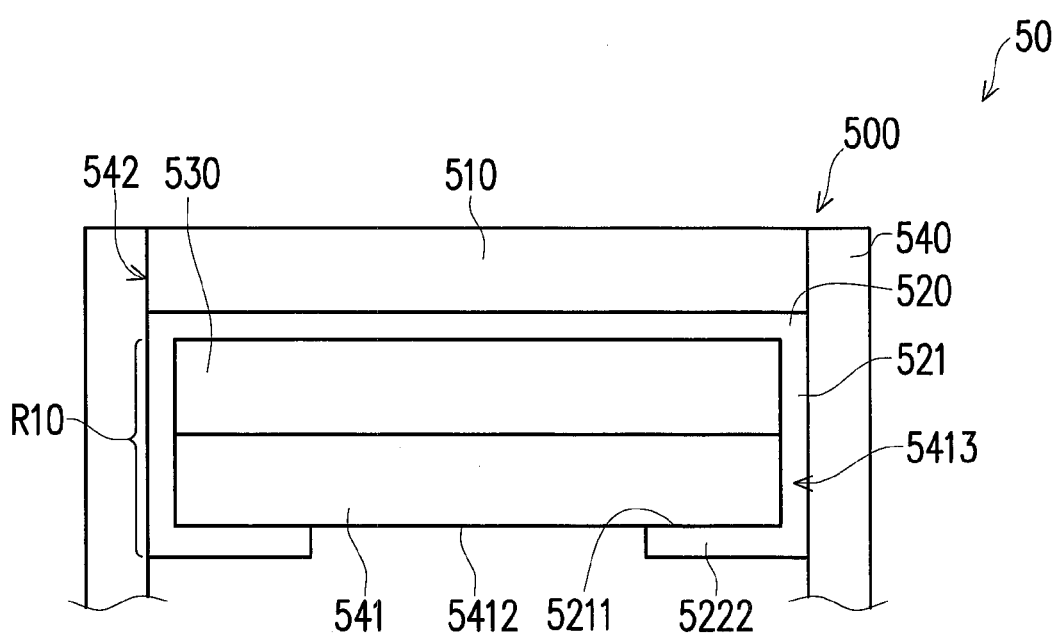
FIG. 5 is a partial, cross-sectional view diagram of an electronic device 50 according to another exemplary embodiment of the invention.

FIG. 5 is a partial, cross-sectional view diagram of an electronic device 50 according to another exemplary embodiment of the invention. In this exemplary embodiment, the electronic device 50 includes a case 540 and a display unit 500. The display unit 500 includes a display module 530, a transparent cover layer 510 and a transparent adhesive tape 520. The transparent adhesive tape 520 is disposed between the display module 530 and the transparent cover layer 510, and includes a flange portion 521 extending beyond the display module 530. The display unit 500 is configured in a holding compartment 542 of the case 540. The back plate 541 of the case 540 includes a hole 5413. The flange portion 521 of the display unit 500 passes through the hole 5413 and is bent to bond with the back plate 541 of the case 540, wherein the first flange surface 5211 of the flange portion 521 is bonded to the bottom surface 5412 of the back plate 541 that is farther away from the display module 530 in order to secure the display unit 500 on the electronic device 5211. This type of bonding structure is achieved by disposing an adhesive material at the first flange surface 5211 of the flange portion 521 only. The fabrication of the transparent adhesive tape 520 is thus simpler. Further, the flange portion 521 is directly bonded to the bottom surface 5412 of the back plate 541; the adhesion strength is thus greater than that in the previous exemplary embodiment and the bonding between the display unit 500 and the case 540 is less likely to become detached.

Figure 6:
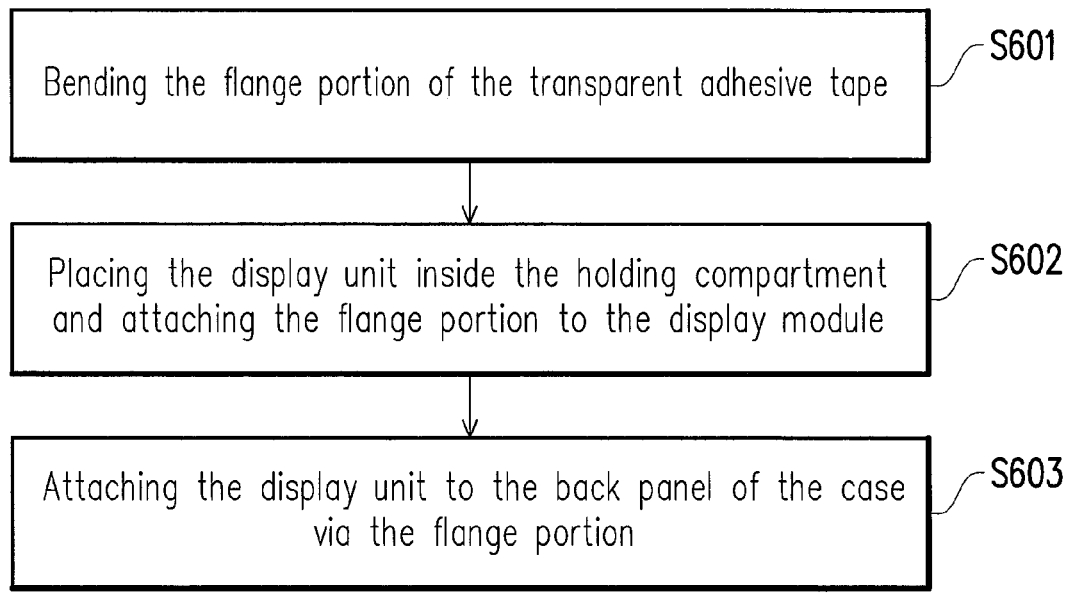
FIG. 6 is a flow chart of steps of an exemplary assembling method of an exemplary embodiment of the invention.

FIG. 6 is a flow chart of steps of an assembling method of an exemplary embodiment of the invention. Referring to FIGS. 6 and 4, the invention further provides an assembling method of an electronic device. The electronic device 40 includes a case 440 and a display unit 400. The display unit 400 includes a display module 430, a transparent cover layer 410 and a transparent adhesive tape 420. The transparent adhesive tape 420 is configured between the display module 430 and the transparent cover layer 410, and comprises a flange portion 421 extending beyond the display module 430. The case 440 includes a back plate 441. The assembling method of an electronic device of the exemplary embodiment of the invention includes the following process steps. First, the flange portion 421 of the transparent adhesive tape 420 is bent in step 601. The display unit 400 is placed inside the holding compartment 442, and the first flange surface 4211 of the flange portion 421 is attached to the display module 430 in step S602. Thereafter, the display unit 400 is attached to the top surface 4411 of the back plate 441 of the case 440 via the flange portion 421. The first flange surface 4211 of the flange portion 421 is attached to the display module 430, while the second flange surface 4212 is attached to the top surface 4411 of the back plate 441 to secure the display unit 400 on the display device 40 in step S603.

Figure 7:
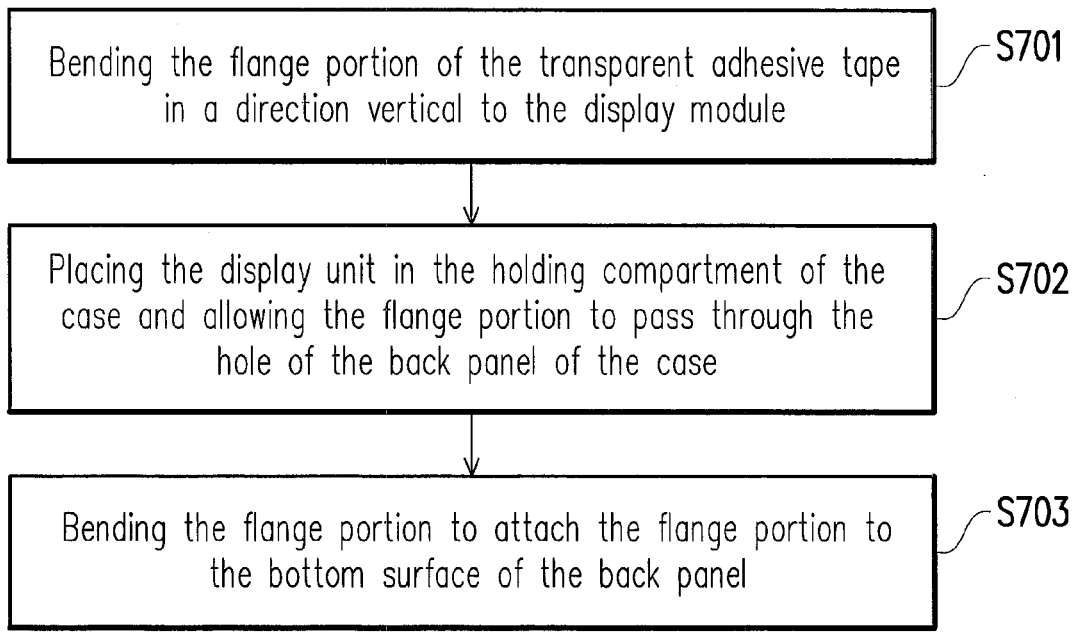
FIG. 7 is a flow chart of steps of an exemplary assembling method of another exemplary embodiment of the invention.

FIG. 7 is a flow chart of steps of an exemplary assembling method of another exemplary embodiment of the invention. Referring to FIGS. 7 and 5, the electronic device 50 includes a case 540 and a display unit 500. The display unit 500 includes a display module 530, a transparent cover layer 510 and a transparent adhesive tape 520. The transparent adhesive tape 520 is placed between the display module 530 and the transparent cover layer 510, and includes a flange portion 521 extending beyond the display module 530. The back plate 541 of the case 540 includes at least a hole 5413. The assembling method of an electronic device of the exemplary embodiment of the invention includes the following process steps. First, the flange portion 521 of the transparent adhesive tape 520 is bent in a direction vertical to the display module 530 in step S701. Then, the display unit 500 is placed in the holding compartment 542 of the case 540 and the flange portion 521 is allowed to pass through the hole 5413 of the back plate 541 of the case 540 in step S702. Thereafter, the flange portion 521 is bent, allowing the first flange surface 5211 to attach to the back plate 541 at the bottom surface 5412 that is farther away from the display module 530 to secure the display unit 500 on the electronic device 50 in step S703.

Accordingly, in the display unit, and the electronic device, and the assembling method of the electronic device of the invention, the flange portion of the transparent adhesive tape can be bent to the back side of the display module. Hence, the display unit is secured without having the case to cover the display unit. Accordingly, the viewable range of the screen is substantially increased. Alternatively, the flange portion of the transparent adhesive tape is allowed to pass through the hole of the back plate of the above-mentioned holding compartment; and after passing through the hole, the flange portion is bent to attach to the surface of the back plate that is farther away from the display module. Accordingly, the bonding strength between the display unit and the electronic device is enhanced and the anchoring is even more secured.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An electronic device, comprising:
   a case, comprising a holding compartment;
   a display unit, configured in the holding compartment, and the display unit comprising:
   a display module, comprising a first surface and a corresponding second surface, wherein an image is displayed on the first surface;
   a transparent cover layer; and
   a transparent adhesive tape, disposed between the first surface of the display module and the transparent cover layer, and the transparent adhesive tape is adhered to the transparent cover layer,
   wherein the transparent adhesive layer comprises a flange portion extending beyond the first surface, and the flange portion is bent to a back side of the display module for securing the display unit to the case, wherein the transparent adhesive tape further comprises a touch panel and an adhesive material, and a portion of an opaque conductive line region distributed with metal lines of the touch panel is configured at the flange portion bent to the back side of the display module; wherein the second surface is leaned against a back plate of a bottom of the holding compartment, and the flange portion is bent to the second surface and passes through at least a hole of the back plate, and both surfaces of a portion of the flange portion that is bent to the second surface comprise an adhesive, wherein one surface of the both surfaces is adhered to the second surface of the display module, and another surface of the both surfaces is adhered to the back plate.

2. The electronic device of claim 1, wherein the flange portion is bent to the second surface, and a portion of the flange portion that is in contact with the second surface comprises an adhesive for adhering to the display module.

3. The electronic device of claim 1, wherein a border of the flange portion comprises a perforated line for bending.

4. The electronic device of claim 1, wherein the transparent adhesive tape completely covers the first surface.

5. An assembling method of an electronic device, the assembling method comprising:
   disposing a display unit in a holding compartment of a case of the electronic device, wherein the display unit comprising a display module wherein an image is displayed on a first surface of the display module, a transparent cover layer and a transparent adhesive tape, and the transparent adhesive tape which comprises a flange portion extending beyond the display module is disposed between the display module and the transparent cover layer, wherein the transparent adhesive tape further comprises a touch panel and an adhesive material; and
   bending the flange portion to a back side of the display module for the display unit to adhere to an inside of the holding compartment, wherein a portion of an opaque conductive line region distributed with metal lines of the touch panel is configured at the flange portion bent to the back side of the display module; wherein a second surface opposed to the first surface is leaned against a back plate at a bottom of the holding compartment, and the flange portion is bent to the second surface and passes through at least a hole of the back plate, and both surfaces of a
   portion of the flange portion that is bent to the second surface comprise an adhesive, wherein one surface of the both surfaces is adhered to the second surface of the display module, and another surface of the both surfaces is adhered to the back plate.

6. An electronic device, comprising:
   a case, comprising a holding compartment; and
   a display unit, configured in the holding compartment, and the display unit comprising:
   a display module, comprising a first surface and a corresponding second surface, wherein an image is displayed on the first surface;
   a transparent cover layer; and
   a transparent adhesive tape, disposed between the first surface of the display module and the transparent cover layer, the transparent adhesive tape is adhered to the transparent cover layer, and the transparent adhesive tape is a single piece,
   wherein the transparent adhesive layer comprises a flange portion extending beyond the first surface, and the flange portion is bent to a back side of the display module for securing the display unit to the case of the electronic device, wherein the second surface of the display module is leaned against a back plate of a bottom of the holding compartment of the electronic device, and both surfaces of the portion of the flange portion bent to the second surface comprise an adhesive, wherein one surface of the both surfaces is adhered to the second surface of the display module, and another surface of the both surface is adhered to the back plate of the bottom of the holding compartment of the electronic device.

* * * * *